United States Patent [19]

Bladon

[11] Patent Number: 5,007,990

[45] Date of Patent: * Apr. 16, 1991

[54] ELECTROPLATING PROCESS

[75] Inventor: John J. Bladon, Wayland, Mass.

[73] Assignee: Shipley Company Inc., Newton, Mass.

[*] Notice: The portion of the term of this patent subsequent to Aug. 28, 2006 has been disclaimed.

[21] Appl. No.: 153,357

[22] Filed: Feb. 8, 1988

Related U.S. Application Data

[63] Continuation-in-part of Ser. No. 71,865, Jul. 10, 1987, abandoned.

[51] Int. Cl.$^5$ .............................................. C25D 5/54
[52] U.S. Cl. ........................................ 204/15; 204/20; 204/30; 204/38.4; 430/315
[58] Field of Search .................... 204/30, 38.4, 15, 20; 430/313, 314, 315

[56] References Cited

U.S. PATENT DOCUMENTS

| | | | |
|---|---|---|---|
| 844,304 | 2/1907 | Daly | 204/21 |
| 3,011,920 | 12/1961 | Shipley, Jr. | 117/213 |
| 3,099,608 | 7/1963 | Radovsky et al. | 204/15 |
| 3,533,918 | 10/1970 | Smith | 204/30 |
| 3,658,661 | 4/1972 | Minklei | 204/30 |
| 3,874,882 | 4/1975 | Gulla et al. | 106/1 |
| 3,993,491 | 11/1976 | Feldstein | 106/1 |
| 3,993,799 | 11/1976 | Feldstein | 427/53 |
| 4,166,012 | 8/1979 | Quinn et al. | 204/30 |
| 4,683,036 | 7/1987 | Morrissey | 204/15 |

FOREIGN PATENT DOCUMENTS 2123036A 1/1984 United Kingdom.

OTHER PUBLICATIONS

F. A. Lowenheim, Electroplating, McGraw-Hill Book Co., New York, 1978, pp. 389–409, 416–425.
Patent Abstracts of Japan, vol. 10, No. 136 (C-347) 2193, May 20, 1986; & JP-A-60 258 494, 12/20/85.
Chemical Abstracts, vol. 104, Jun. 1986, No. 24, p. 514, Abstract No. 215269, & JP-A 60 258 494, 12/20/85.

Primary Examiner—John F. Niebling
Assistant Examiner—William T. Leader
Attorney, Agent, or Firm—Robert L. Goldberg

[57] ABSTRACT

A method for metal plating the surface of an article formed from an organic plastic. The method includes a step of passing a current between two electrodes immersed in an electrolyte containing dissolved plating metal. One of the electrodes is the article to be plated and is provided with a surface having areas of a catalytic metal chalcogenide conversion coating adjacent to and in contact with conductive areas. The metal sulfide is of a metal that would be catalytic to electroless metal deposition. The method is especially useful for the formation of printed circuit boards and is sufficiently versatile to permit formation of a printed circuit board by a process that involves pattern plating.

15 Claims, No Drawings

ELECTROPLATING PROCESS

CROSS REFERENCE TO RELATED APPLICATIONS

This application is a continuation in part of copending U.S. patent application Ser. No. 071,865 filed Jul. 10, 1987, now abandoned.

BACKGROUND OF THE INVENTION

I. Introduction

This invention relates to electroplating nonconductors, and more particularly, to a process for electroplating the surface of a nonconductor by converting an adsorbed colloid into a chemically resistant, metal chalcogenide conversion coating, which functions as a base for direct electroplating. The invention is particularly useful in the manufacture of printed circuit boards where copper is deposited over a circuit board base material.

II. Description of the Prior Art

Nonconductive surfaces are conventionally metalized by a sequence of steps comprising catalysis of the surface of the nonconductor to render the same catalytic to an electroless metal deposit followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrode position of a metal over the electroless metal coating to a desired full thickness. Electrolytic deposition is possible because the electroless metal deposit serves as a conductive coating that permits electroplating.

Catalyst compositions used for electroless metal plating are known in the art and disclosed in numerous publications including U.S. Pat. No. 3,011,920, incorporated herein by reference. The catalysts of this patent consist of an aqueous suspension of a tin noble or precious (catalytic) metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing dissolved metal and reducing agent in solution. The presence of dissolved metal and reducing agent together in solution results in plate out of metal in contact with a catalytic metal tin catalyst. However, the presence of the dissolved metal and reducing agent together in solution can also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by the use of stabilizers which inhibit indiscriminate deposition, but which also retard plating rate.

Attempts have been made in the past to avoid the need for an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin palladium colloid which forms an essentially nonconductive film of colloidal palladium particles over the nonconductive surface. This is the same tin palladium colloid used as a plating catalyst for electroless metal deposition. For reasons not fully understood, it is possible to electroplate directly over the catalyzed surface of the nonconductor from an electroplating solution though deposition occurs by propagation from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from said interface.

An improvement in the process of U.S. Pat. No. 3,099,608 is disclosed in U.K. Patent No. 2,123,036B, incorporated herein by reference. In accordance with the process described in this patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S Pat. No. 3,099,608 —i.e., by immersion of the nonconductive surface in a solution of a tin palladium colloid. The additive in the electroplating solution responsible for inhibiting deposition is described as one selected from the group of dyes, surfactants, chelating agents, brighteners and leveling agents. Many of such materials are conventional additives for electroplating solutions.

There are limitations to the above process. Both the processes of the U.S. and the U.K. patents for direct electroplating require conductive surfaces for initiation and propagation of the electroplated metal deposit. For this reason, the processes are limited in their application to metal plating of nonconductive substrates in areas in close proximity to a conductive surface.

One commercial application of the process of the U.K. patent is the metallization of the walls of through holes in the manufacture of double-sided printed circuit boards by a process known in the art as panel plating. In this application, the starting material is a printed circuit board substrate clad on both of its surfaces with copper. Holes are drilled through the printed circuit substrate at desired locations. For conductivity, the hole walls are catalyzed with a tin palladium colloid to form the required metallic sites on the surfaces of the walls of the through holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the cross section of the substrate, during electroplating, deposition initiates at the interfaces of the copper cladding and the through hole walls and rapidly propagates into the holes. The hole wall is plated to desired thickness within a reasonable period of time. Thereafter, the circuit board is finished by imaging and etching operations.

A disadvantage to the above panel plating process is that copper is electroplated over the hole wall and over the entire surface of the copper cladding. The steps following plating involve imaging with an organic coating to form a circuit pattern and removal of copper by etching. Therefore, copper is first electrolytically deposited and then removed by etching, a sequence of steps which is wasteful of plating metal, etchant and time, and therefore, more expensive.

The art, recognizing the disadvantages of panel plating, has developed a method for manufacture of printed circuit boards known as pattern plating. In this process, a printed circuit board base material is drilled at desired locations to form through holes. The through holes are metalized using conventional electroless plating techniques. Electroless copper is plated onto the walls of the through holes and over the copper cladding. Thereafter, photoresist is applied and imaged to form the circuit pattern. The board is then electroplated with copper depositing on the copper conductors and through hole walls, but not over the entire surface of the copper cladding. Solder mask is then plated over the exposed copper by immersion or electroplating and the remaining photoresist is stripped. The copper not protected by the solder is then removed by etching to form the copper circuit.

Pattern plating cannot be used with the metalizing process of the aforesaid U.K. patent. The treatment of the copper cladding prior to the application of the photoresist and the development of the photoresist, all as required for pattern plating, requires the use of treatment chemicals found to dissolve or desorb the tin palladium colloid from hole walls. Since this occurs prior to electroplating, direct electroplating to provide conductive through holes becomes impossible.

Copending U.S. patent application Ser. No. 07/071,865, filed Jul. 10, 1987, now abandoned, and assigned to the same assignee as the subject application, provides a new method for direct electroplating of the surface of a nonconductor and to articles manufactured by said method. The process is in an improvement over the process of the above referenced U.K. Patent.

The invention disclosed in the copending application was predicated upon a combination of discoveries. One discovery was that sulfide films of metals that function as electroless deposition catalysts ma be electroplated directly without requiring an intermediate electroless coating. Another discovery of the invention was that many of such sulfide films are insoluble and unaffected by treatment chemicals used for plating of plastics and circuit board fabrication and therefore, the process of the invention was suitable for the formation of printed circuits using pattern plating procedures.

The process of the copending patent application is illustrated by the plating sequence that follows and is compared to a conventional plating process requiring electroless metal deposition.

|  | Conventional Process (A) | Inventive Process (B) |
| --- | --- | --- |
| Step 1 | Desmear with chromic or sulfuric acid or plasma | Desmear with chromic or sulfuric acid or plasma |
| Step 2 | Clean and condition with detergent type material | Clean and condition with detergent type material |
| Step 3A | Microetch copper cladding | — |
| Step 4 | Catalyst predip | Catalyst predip |
| Step 5 | Catalyze with catalytic colloid | Catalyze with catalytic colloid |
| Step 6 | Accelerate | Accelerate (optional) |
| Step 7 | Deposit electroless metal | Treat with sulfide solution |
| Step 7B | — | Microetch copper cladding |
| Step 8 | Electroplate | Electroplate |

A comparison of the two processes illustrated above demonstrates that the process disclosed in the copending application replaces the need for electroless plating with a direct electroplating step thereby eliminating the need for a costly electroless metal plating solution that may be subject to stability and disposal problems. The elimination of the electroless plating step is accomplished without an increase in the total number of steps required for metal deposition. Further, the process of the invention was found to be unaffected by conventional processing chemicals used for metal plating of plastics and formation of printed circuit boards.

In the process of the copending application illustrated above, contact of the catalytic metal on the surface of the nonconductor with a sulfide treatment solution (Step 7) results in the formation of a metal sulfide conversion coating of the catalytic metal (the catalytic metal sulfide). The sulfide solution may be a simple aqueous solution of a water soluble alkali or alkaline earth metal sulfide or a solution of a covalently bonded sulfide such as a thiocarbonate or a dithiodiglycolate. In accordance with the invention of the copending application, the catalytic metal sulfide formed by treatment with the sulfide solution is a suitable conversion coating for direct electroplating.

For the formation of printed circuit boards using the process of the copending application, it is preferred that an etching step be used subsequent to formation of the catalytic metal sulfide film over the surface of the nonconductor (Step 7B above). This etching step may use the same etchants as used in the conventional process to clean copper cladding (Step 3A above). It is preferred that the etching step be deferred to a point subsequent to the step of formation of the catalytic metal sulfide conversion coating so that the etchant may remove sulfide residues on the surface of the copper cladding. It is an advantage of the process that the catalytic metal sulfide conversion coating over the nonconductive surface is essentially unaffected by the step of etching the copper cladding. It is a further advantage that any residues deleterious to copper-copper bonding left on the copper by a photoresist used in the manufacture of printed circuit boards may be readily removed by a more aggressive etchant than was possible in a conventional plating line where the electroless copper is only about 100 microinches thick over the hole wall.

The final step in the process of the copending application comprised electroplating of the thin catalytic metal sulfide conversion coating. This was accomplished using standard electroplating procedures. The procedures of the above referenced U.K. Patent are suitable for electroplating the sulfide coating described therein.

SUMMARY OF THE INVENTION

The copending patent application was directed to a process that permitted direct plating over a nonconductor coated with a sulfide conversion coating. In accordance with the present invention, it has been discovered that chalcogenides of colloidal particles, in addition to sulfides, function as a suitable conversion coating for direct electrolytic deposition. Consequently, in accordance with the invention set forth herein, the range of suitable materials for formation of a conversion coating has been expanded.

DEFINITIONS

The term "non conductor" means an article having at least a portion of its surface inadequately conductive for direct electroplating. The non conductor must be in contact with a metal surface which can be a part of the surface of the non conductor or which can be placed in contact with the non conductor for electroplating. In the preferred embodiment of the invention, the term "non conductor" refers to a printed circuit board base material such as a copper clad epoxy or phenol sheet.

The term "U.K. Patent" means U.K. Patent No. 2,123,036B.

The term "catalytic metal" means a reduced metal catalytic to the deposition of electroless metal and includes noble and precious metals as described in U.S. Pat. No. 3,011,920 and non noble metals catalytic to electroless deposition as disclosed in U.S. Pat. Nos. 3,993,799 and 3,993,491. However, where non noble metals are used as the catalytic metal, caution must be exercised in the use of etchants to avoid removal of the catalytic metal sulfide conversion coating and for this reason, where the non noble metals are used, the process of the invention may not be suitable for formation of printed circuits using pattern plating procedures.

DESCRIPTION OF THE PREFERRED EMBODIMENTS

The subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board manufacture.

A recent trend in the printed circuit board industry is to use a permanganate conditioner in the fabrication sequence. Though desirable, it is optional. The description which follows illustrates the process of the subject invention without permanganate treatment though it should be recognized that permanganate treatment may be used and the advantages of permanganate treatment will be realized if incorporated into the process of the invention. Details of permanganate treatment can be found in U.S. Pat. No. 4,515,829, incorporated herein by reference.

In printed circuit board manufacture, the substrate commonly used is an epoxy substrate filled with glass fibers and copper clad on at least one of its surfaces. As is known in the art, the epoxy can be substituted or mixed with other resins for specific purposes.

In the manufacture of a double-sided printed circuit board, a first step comprises the formation of through holes by drilling or punching or any other method known to the art Following formation of the holes, it is desirable to employ the conventional steps of desmearing the holes (Step 1 above) by sulfuric acid, chromic acid or plasma etching or etchback of the holes with chromic acid, followed by glass etching. Thereafter, the processing sequence of the subject invention may be employed.

Following desmearing or etchback of the holes, the circuit board base material is conventionally treated with a glass etch that removes glass fibers extending into the holes from the hole walls. This is followed by a solution that cleans the copper surface and conditions the hole wall to promote catalyst adsorption. Such solutions are often referred to as cleaner conditioners and typically comprise an aqueous alkaline surfactant solution for cleaning soil and a quaternary amine to condition the hole wall. This treatment step, by itself, is old in the art and does not constitute a part of the invention. Proprietary cleaner conditioners are commercially available and a suitable material is available from Shipley Company Inc. of Newton, Mass. and identified as Cleaner Conditioner 1175.

The next step in the processing sequence is immersion of the part in a catalyst pre-dip solution. Such solutions consist of the same medium as the catalyst solution but without the colloid. The purpose is to prevent the pH and chloride concentration of the catalyst from being altered by dragging in rinse water. As with the cleaner conditioner, the catalyst pre-dip is a conventional step and does not constitute a part of the subject invention. Proprietary catalyst pre-dip compositions are commercially available and a suitable material is available from Shipley Company Inc. and identified as Cataprep® 404.

The next step in the process comprises catalysis of the surface of the nonconductor. Catalysis involves immersion of the nonconductor into an aqueous catalyst composition. The catalysts of U.S. Pat. Nos. 3,011,920 and 3,874,882 are preferred catalysts for this purpose. These catalysts comprise the reduction product formed by the reduction of a noble or precious catalytic metal by tin in acidic medium. The reduction product of palladium by tin in acidic media is the most preferred catalytic material for purposes of this invention. A suitable proprietary catalyst is identified as Cataposit® R-44 catalyst and is available from Shipley Company Inc. Non noble metal catalysts are also suitable, but lesser preferred, especially in the manufacture of printed circuit boards using pattern plating procedures. Suitable non noble metal catalysts include copper, nickel, cobalt, etc. and are disclosed in U.S. Pat. Nos. 3,993,799 and 3,993,491 incorporated herein by reference.

The step of catalysis is accomplished by immersion of the nonconductor in the catalyst solution for period of time ranging between 1 and 10 minutes. Catalyst temperature can vary between about room temperature and 150° F. Catalysis is required by the process of the subject invention. However, the procedure used to catalyze the nonconductor is in accordance with prior art procedures and does not constitute a part of the subject invention.

Following catalysis, the nonconductor is preferably contacted with a solution identified in the art as an accelerator. This material is particularly useful when the catalyst is one formed by the reduction of the catalytic metal with tin. The reduction reaction forms a tin oxide protective colloid that is believed to insulate the catalytic metal. The accelerator removes at least a part of the tin oxide. A suitable accelerator is a mild acid solution such as hydrochloric acid or perchloric acid. Acceleration is accomplished by immersion of the nonconductor in an aqueous solution of the accelerator for a period of time ranging between 1 and 5 minutes at a temperature ranging between about room temperature and 150° F. Unlike the step of catalysis, the step of acceleration is not mandatory, but is preferred. The procedure used for acceleration is in accordance with prior art procedures and does not constitute a part of the subject invention.

In the prior art, the next step in the process of plating a nonconductor would be electroless metal deposition from an electroless plating solution. In accordance with the subject invention, this step is unnecessary. Instead, the next step in the process is the formation of the conversion coating by the chemical conversion of the catalytic layer to a layer believed to be a chalcogenide of the catalytic layer. Chalcogenide formation occurs by contact of the catalytic layer with a solution of a chalcogen.

The chalcogenide treatment solution is one comprising a chalcogen preferably dissolved in a suitable solvent. For metal plating operations, aqueous solutions are preferred and in accordance with a preferred embodiment of the invention, an aqueous solution of a water soluble chalcogen salt may be used. Sulfide is the preferred chalcogen. Selenides and tellurides are satisfactory, but longer plating times are required. Anhydrous oxides of some metals may be used, but are least preferred as too great a plating time may be required. Most preferred are alkaline earth metal sulfide salts such as sodium, potassium and lithium sulfides.

In accordance with the process of the prior application, the salt contribution was not considered to be critical and a concentration of from 0.1 to 15 grams per liter of the salt was considered adequate with a range of from 1 to 5 grams per liter being preferred. The concentration range given in the prior application is accurate, but it is a discovery of the subject invention that unexpectedly, deposition rate significantly increases as the chalcogen concentration decreases. Though not wishing to be bound by theory, it is believed that the chalcogen must be present in sufficient concentration to convert the colloid deposited over the nonconductor to a satisfactory conversion coating, but excess chalcogen may inhibit deposition rate. Therefore, in accordance with the subject invention, the concentration range of the chalcogen salt in solution may vary from 0.001 to 15 grams per liter of solution, but the preferred concentration of the chalcogen salt in solution varies between 0.001 and 2.0 grams per liter and more preferably, ranges between 0.01 and 0.5 grams per liter.

In the prior co-pending application, when the process was used to prepare a metal clad nonconductor for electroplating, problems were occasionally encountered using a simple sulfide salt solution. The problems were caused by contact of sulfide ions with the metal cladding of a clad circuit board base material. This resulted in the formation of a metal sulfide over the surface of the cladding—i.e., copper sulfide when the nonconductor is a copper clad printed circuit board base material. The copper sulfide formed was a dense, black layer insoluble in common etchants but nonetheless could be removed from the copper surface to which it was not firmly adhered using conventional procedures such as scrub cleaning. The copper sulfide surface was undesirable as it interfered with copper to copper bonding during subsequent electroplating processes as conventional in printed circuit board formation.

In accordance with a preferred embodiment of the prior copending application, copper sulfide formation was reduced when the sulfide solution used was one where the sulfur was covalently bonded such as the covalent bond between carbon and sulfur. A metal thiocarbonate solution is an example of a covalently bonded sulfide compound. The covalently bonded sulfides were used in concentrations and under conditions equivalent to those set forth above for the simple sulfide solutions.

In accordance with the process of the subject invention, it has been found that simple salts of chalcogens are preferred to the covalently bonded sulfide compounds of the prior application when used in lower concentration ranges.

In accordance with the processes disclosed herein, treatment with a chalcogenide solution results in conversion of the layer of catalytic metal to a dark brown to black, conversion coating suitable for direct electroplating. It is believed that this treatment forms a catalytic (to electrolytic deposition) metal chalcogenide conversion coating.

Following formation of the conversion coating as described above, the nonconductor may be directly electroplated. If the nonconductor is a copper clad printed circuit base material, the copper cladding should be cleaned such as, for example, by use of a sulfuric acid - hydrogen peroxide pre-etch, for example, Preposit®$^R$746 etchant available from Shipley Company Inc. of Newton, Mass. The etchant may be used at room temperature for a period of time ranging between 1 and 3 minutes. It should be noted that unexpectedly, treatment with the etchant does not result in attack upon the conversion coating of the invention.

The next step in the process of the invention comprises electroplating directly over the conversion coating avoiding the intermediate step of electroless metal plating. The electroplating procedure is similar to the procedure disclosed in the above referenced U.K. Patent, but careful control of the electroplating parameters as required in the process of the U.K. Patent is not necessary in the process of this invention. The electroplating process may use electroplating solutions such as those disclosed in the U.K. Patent, but most commercially available electroplating solutions contain additives which make most commercially available electroplating solutions suitable for the process of the invention. The preferred electroplating metals in accordance with the invention are copper and nickel though the process is suitable for electroplating of any desired metal. A typical electroplating solution comprises an aqueous acid solution of the metal desired to be plated together with proprietary additives from the groups of dyes, surfactants, chelating agents, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other N-heterocyclic compounds; triphenyl methane type dyes and aromatic amines, imines and diazo compounds. Suitable surfactants included in such baths typically include non-ionic surfactants such as alkylphenoxy polyethoxyethanols, e.g., octylphenoxy, polyethoxyethanol, etc. Surfactants include wetting agents and water soluble organic compounds such as compounds containing multiple oxyethylene groups have been found to be effective. A preferred group of said compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 10 through 40 amps per ft$^2$. Theoretically, a low initial current density should be preferred with current density increased as an initial deposit is formed. This would be expected to prevent burn off of the thin conversion coating. However, in practice, adverse results caused by a high initial current density have not been observed. A preferred current density range is from 15 to 30 amps per ft$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The chemical resistance of the catalytic metal chalcogenide conversion coating to treatment solutions permits simplified printed circuit board manufacturing processes impractical or inoperative in the prior art. For example, a pattern plating sequence, as described above, could not be used with the direct electroplating process of the U.K. Patent because the pretreatment steps would remove or dissolve adsorbed colloid thereby making it impossible to first treat and image and then electroplate. This is a serious disadvantage because it severely limits the type of circuit board that can be fabricated using the process of the U.K. Patent. The conversion coating of the subject invention remains unaffected when contacted with treatment chemicals required for pattern plating. Therefore, a pattern plating process for formation of printed circuit boards is possible using the process of the subject invention. Such a process is illustrated in the sequence of steps described below using a predrilled and desmeared copper clad circuit board base material:

|  | Pattern Plating Sequence |
| --- | --- |
| Step 1 | Clean and condition |
| Step 2 | Catalyst pre-dip |
| Step 3 | Catalyze |
| Step 4 | Treat with accelerator |
| Step 5 | Treat with chalcogen |
| Step 6 | Acid clean copper cladding |
| Step 7 | Apply and image photoresist |
| Step 8 | Develop photoresist image |
| Step 9 | Clean and then microetch copper cladding |
| Step 10 | Electroplate |
| Step 11 | Apply solder resist |
| Step 12 | Remove remaining photoresist |
| Step 13 | Remove copper bared by removal of photoresist. |

Step 5 above results in the formation of the chalcogenide conversion coating of the invention. Pattern plating is possible in accordance with the invention because the etchants and alkaline developers used to develop the photoresist layer do not adversely effect or inactivate the sulfide conversion coating. These same materials would inactivate, desorb or dissolve the palladium tin colloidal coating used for direct electroplating in the process of the U.K. Patent.

The invention will be better understood by reference to the Examples which follow where, unless stated otherwise, the substrate treated was an epoxy copper clad circuit board base material provided with a random array of through holes and commercial formulations are available from Shipley Company Inc. of Newton, Mass.

EXAMPLES 1 to 5

The following examples illustrate the formation of a sulfide conversion coating over a substrate followed by electroplating.

Five circuit board substrate materials were subjected to the following procedure.

Step 1 Pre-clean and condition a. desmear the hole walls with concentrated sulfuric acid maintained at a temperature of 70° F. for 20 seconds and water rinse;

b. remove glass fibers extending into the holes by etching with an ammonium bifluoride solution (1 lb./gal.) maintained at 70° F. for 4 minutes and water rinse;

c. clean and condition the copper cladding and hole walls using an alkaline phosphoric acid based solution containing proprietary surfactants identified as Cleaner Conditioner 230 at 10% strength at a temperature of 140° F. for 5 minutes and water rinse.

Step 2 Catalyze a. immerse the substrate in an acidic sodium chloride solution identified as Cataprep ® 404 at a temperature of 70° F. for 1 minute and water rinse.;

b. immerse the substrate in an acidic solution of a palladium-tin colloid identified as CatapositR 44 catalyst at a 6% strength at a temperature of 115° F for 5 minutes and water rinse.

Step 3 Accelerate

Immerse the substrate in an acidic accelerating solution identified as Accelerator 19 at a temperature of 70° F for 1 minute and water rinse.

Step 4 Form conversion coating

Immerse the substrate in a room temperature sulfide solution (as set forth in Table 1 below) for 2 minutes and water rinse.

Sulfide solutions used in the Examples are described in the following table where for each example, the concentration of the sulfide in solution was 10 grams per liter except in Example 5 where a neat solution was used.

TABLE 1

| Example Number | Sulfide | Solution pH | pH adjustor |
| --- | --- | --- | --- |
| 1 | sodium sulfide | 12–12.5 | NaOH |
| 2 | sodium thiocarbonate | 12–12.5 | NaOH |
| 3 | sodium diethyldithiocarbamate | 12–12.5 | NaOH |
| 4 | sodium dithiodiglycolic acid | 12–12.5 | NaOH |

TABLE 1-continued

| Example Number | Sulfide | Solution pH | pH adjustor |
|---|---|---|---|
| 5 | carbon disulfide | NA | NA |

Boards prepared by the preceding steps were observed for appearance. The copper surface of the board of Example 1 had a thick dark gray film while those of Examples 2 to 5 possessed a thinner film.

The boards prepared in accordance with Steps 1 to 4 and having a sulfide conversion coating were electroplated by the following sequence of steps:

Step 5 Remove conversion coating from copper

Immerse the coated board in a peroxide sulfuric etchant identified as Pre-Etch 746 etchant at a temperature of 110° F. for 1 minute and water rinse.

Step 6 Microetch the copper surfaces

Immerse the board in a persulphate etchant (¼ lb./gallon) identified as Pre-Etch 748 at 70° F. for 1 minute and water rinse.

Step 7 Electroplate

Electroplate copper from an acid copper electroplating bath identified as ElectropositR 892 acid copper at a current density of 30 amps/sq. ft. and at a temperature of 70° F. for 30 minutes and water rinse.

Treatment of Example 1 boards with the peroxide etchant (step 5) resulted in large flakes of precipitate floating in the bath. The origin of this material is the film on the copper surface. The film can be seen lifting off the copper surfaces when the board is immersed in the bath and large flakes of the insoluble material are seen in the bath. When the boards of Examples 2 to 5 are immersed in the peroxide etchant, precipitate also appears, but to a much lesser extent. In all cases, copper plated onto the walls of the through holes and onto the copper cladding exhibit excellent bond strength.

Examples 1 and 2 constitute the most preferred embodiments of the direct electroplating process of the invention even though Example 1 requires cleaning of the heavier sulfide coating.

EXAMPLES 6 and 7

These examples demonstrate a process for panel plating. Boards were prepared following the procedures defined in steps 1 through 7 above using the sodium sulfide solution of Example 1 (Example 6) and the sodium thiocarbonate solution of Example 2 (Example 7). Following electrolytic deposition over the sulfide conversion coating, the following steps were used:

Step 8 Apply and image photoresist a. dry the cleaned boards;
b. apply a dry film of Riston®R 3015 photoresist (available from E. I. DuPont de Nemours and Company of Wilmington, Delaware) at an application temperature of between 98 and 110° C. and at a speed of from 1 to 3 ft/min. and wait 15 minutes following application of the film; and
c. expose the film to a source of activating energy to obtain the desired circuit pattern at an exposure of 40 mJ/cm and then wait 15 minutes.

Step 9 Develop imaged photoresist

Place the imaged board in a spray chamber using a solution consisting of 5 pounds of sodium carbonate and 1 gallon of butyl carbitol per 60 gallons and develop at a temperature of 85° F. for 1 minute.

Step 10 Electroplate solder

Immerse the substrate in a tin/lead fluoroborate plating solution identified as Electroposit 280 Tin/Lead at a temperature of 85° F. using a cathode current density of between 10 and 40 amps/sq. ft. for 60 minutes.

Step 11 Remove photoresist

Spray the board with a 2% potassium hydroxide solution at a temperature of 85° F. for 1 minute. Step 12 Etch copper Spray the board with an ammoniacal copper etchant at 110° F. until all of the exposed copper is removed.

In both examples, copper coverage over all surfaces including through holes was excellent.

EXAMPLES 8 and 9

The following examples demonstrate a process for pattern plating in the formation of a printed circuit board using the process of the invention.

Boards were prepared following the procedures defined in steps 1 through 5 of Examples 1 to 5 using the sodium sulfide solution of Example 1 (Example 8) or the sodium thiocarbonate solution of Example 2 (Example 9). Following formation of the sulfide conversion coating and the removal of sulfide coating from copper surfaces, the following steps were followed:

Step 6 Apply and image photoresist a. dry the cleaned boards;
b. apply a dry film of RistonR 3015 photoresist available from E. I. DuPont de Nemours and Company of Wilmington, Delaware at an application temperature of between 9s and 110° C. and at a speed of from 1 to 3 ft/min. and wait 15 minutes following application of the film; and
c. expose the photoresist film to a source of activating energy through a master to obtain the desired circuit pattern at an exposure of 40 mJ/cm and wait 15 minutes.

Step 7 Develop the photoresist

Place the substrate in a spray chamber using a solution consisting of 5 pounds of sodium carbonate and 1 gallon of butyl carbitol per 60 gallons of developer and develop at a temperature of 85° F. for 1 minute.

Step 8 Clean copper

Immerse the sulfide coated board in Acid Cleaner 811 at 110° F. for 1 minute and water rinse.

Step 9 Microetch copper surfaces

Immerse the board in a persulphate etchant (1/4 lb./gallon) identified as Pre-Etch 748 at a temperature of 70° F. for 1 minute and water rinse.

Step 10 Electroplate

Electroplate copper from an acid copper electroplating bath identified as ElectropositR 892 acid copper at a current density of 30 amps/sq. ft. and at a temperature of 70° F. for 30 minutes and water rinse.

Step 11 Electroplate solder

Immerse the developed board in a tin/lead fluoroborate plating solution identified as Electroposit 280 Tin/Lead at a temperature of 85° F. using a cathode current density of between 10 and 40 amps/sq. ft. for 60 minutes.

Step 12 Remove photoresist

Spray the board with a 2% potassium hydroxide at a temperature of 85° F. for 1 minute.

Spray the board with an ammoniacal copper etchant at 110° F. until all of the exposed copper is removed. The above procedure produced circuit boards with good copper to copper bonds. Example 9 constitutes the most preferred embodiment of the invention for formation of circuit boards using pattern plating procedures.

EXAMPLES 10 to 11

To determine the elemental composition of the sulfide conversion coating and the relative proportions of the elements at various stages in the process of the invention, an Electron Scanning Chemical Analysis (ESCA) was performed. This process comprises bombarding a surface of the catalytic metal sulfide conversion coating with high energy electrons and observing the energies of the emitted inner-shell electrons for the various elements.

Six ABS coupons were treated as follows where the treatment steps referred to are those of Example 2

| Coupon No. | Treatment Steps |
| --- | --- |
| 1 | 1 to 3 |
| 2 | 1 to 3 followed by step 5 (Step 4 omitted) |
| 3 | 1 to 4 |
| 4 | 1 to 5 |
| 5 | 1 to 5 followed by Pre-Etch 748 (1/4 lb./gallon) at 70° F. for 1 minute. |
| 6 | Same as coupon 5 followed by Lea Ronal PCM acid copper at 30 amp/sq ft for 30 minutes. |

Coupons 1 and 2 were set aside for visual inspection. The results obtained from ESCA analysis of coupons 3 through 6 are set for the in the following table where palladium, tin and sulfur are in percentages and where carbon and oxygen have been omitted from the percentage calculations.

| Coupon Number | Percentages | | | Ratios | | |
| --- | --- | --- | --- | --- | --- | --- |
| | Pd | Sn | S | Pd/Sn | Pd/S | Sn/S |
| 3 | 34.5 | 10.7 | 54.8 | 3.224 | 0.630 | 0.195 |
| 4 | 50.0 | 9.6 | 40.4 | 5.208 | 1.238 | 0.238 |
| 5 | 61.9 | 11.9 | 26.2 | 5.202 | 2.363 | 0.454 |
| 6 | 41.8 | 4.8 | 53.4 | 8.708 | 0.783 | 0.090 |

Visual observation showed that coupon 1 was darkened, indicating a substantial amount of colloidal palladium - tin catalyst had been adsorbed. Coupon 2 was returned to its original light color after Pre-etch 746 treatment indicating that the metal colloid was easily dissolved and rinsed off the plastic. ESCA analysis of coupon 2 found no tin and only two atomic percent palladium (the remainder being carbon and oxygen). After sulfide treatment of the palladium tin colloid particle, the data established that palladium has only one chemical environment (presumably palladium sulfide), the tin has two environments (possibly tin sulfide and tin oxide), and the sulfur has two environments with no more than 10% of it as other species (possibly various oxidative states of sulfur).

Upon immersion of coupon 6 in the electroplating bath for 20 minutes, copper was deposited outward from the metal clip holding the coupon. Plating was stopped before the coupon was completely coated and the unplated area was analyzed. As can be seen in Table II, the percentage of sulfur present remained high, indicating that the sulfide conversion coating, which enables plating to occur, remained on the coupon throughout the rigorous electroplating process, suggesting that the sulfide conversion coating is durable.

EXAMPLES 12 and 13

This example illustrates formation of selenium and tellurium conversion coatings and plating the same using a 2 inch by 3 inch coupon formed from a copper clad multilayer board with through holes drilled at selected locations as the substrate. In the examples, unless otherwise stated, where commercially available solutions are used, they are used in accordance with the manufacturer's standard instructions for such use. The plating sequence comprised the following steps:

Step 1 Swell and Etch a. contact surface with an alkaline aqueous solution containing an organic solvent identified as MLB Conditioner 12 at 145° F. for 5 seconds and water rinse;

b. contact surface with an alkaline permanganate solution identified as MLB Promoter 213 maintained at 170° F. for 10 minutes and water rinse;

c. neutralize permanganate residues and remove glass fibers by contact with an aqueous alkaline solution of an amine identified as MLB Neutralizer/Glass Etch 219 at a temperature of 120° F. for 5 minutes and water rinse.

Step 2 Clean and Condition clean and condition the copper cladding and hole walls using an aqueous polyamide solution identified as Cleaner Conditioner 231 at 10% strength at a temperature of 100° F. for 5 minutes and water rinse.

Step 3 Catalysis a. immerse the substrate in an acidic sodium chloride solution identified as Cataprep ® 404 at a temperature of 70° F. for 1 minute and water rinse; and b. immerse the substrate in an acidic solution of a palladium-tin colloid identified as CatapositR 44 catalyst at a 6% strength at a temperature of 110° F. for 10 minutes and water rinse.

Step 4 Accelerate

Immerse the substrate in an acidic accelerating solution identified as Accelerator 19 at a temperature of 70° F. for 30 seconds and water rinse.

Step 5 Form conversion coating

Immerse the substrate in a room temperature treatment solution (as described below) for 45 seconds at 70° F. to form a conversion coating and water rinse.

Treatment solutions used in these Examples to form a conversion coating were prepared as follows:

Example 12—A solution is prepared by dissolving 3.3 grams of elemental tellurium in 51 mls of concentrated nitric acid and swirling the resulting slurry for several minutes. The solution so formed is slowly diluted with distilled water until a clear green solution is obtained with all tellurium dissolved in the solution. This solution is diluted with 500 ml of distilled water and sodium hydroxide solution is added to bring the pH to between 12 and n 12.5. The solution is then diluted with distilled water to 1 liter.

Example 13 —An aqueous solution is formed by adding 1000 ppm of Selenium Standard (1.4 grams per liter of $SeO_2$ from American Scientific Products) to distilled water. Aqueous sodium hydroxide is added to bring the pH to between 12 and 12.5.

The boards prepared in accordance with Steps 1 to 4 and having a conversion coating were electroplated by the following sequence of steps:

Step 6 Remove conversion coating from copper

Immerse the coated board in a peroxide sulfuric etchant identified as Pre-Etch 746 etchant to which a surfactant is added at a temperature of 120° F. for 1 minute and water rinse.

Step 7 Electroplate

Electroplate copper from an acid copper electroplating bath identified as ElectropositR 892 acid copper at a current density of 30 amps/sq. ft. and at a temperature of 0° F. until complete coverage is obtained and water rinse. Coverage of the copper cladding andthe walls of the through holes is complete.

I claim:

1. A method for electroplating an article of manufacture comprising an electrically nonconductive body portion having a surface comprising metallic areas and nonmetallic nonconductive areas adjacent to and in contact with each other, said method comprising the steps of:
   a. treating the surface of said article with an acid solution of a reduced noble metal electroless metal plating catalyst to form a deposit of the reduced noble metal plating catalyst on said nonconductive surface areas;
   b. treating the surface of the article with a solution containing a dissolved chalcogen capable of reacting with the electroless metal plating catalyst to form a chalcogenide of said plating catalyst; and
   c. metal plating the surface of the article by passing a current between said article and an electrode immersed in a current between said article and an electrode immersed in an electolyte containing dissolved plating metal.

2. The method of claim 1 where the electroless metal plating catalyst is a tin-palladium catalyst and the chalcogen is a sulfide.

3. The method of claim 2 where the solution used to form the sulfide of the tin-palladium plating catalyst is an aqueous solution of a metal sulfide salt.

4. The method of claim 3 where the solution is a solution of an alkali or alkaline earth metal sulfide in a concentration of from 0.001 to 15 grams per liter of solution.

5. The method of claim 2 where the dissolved plating metal is copper.

6. A method for manufacture of a printed circuit board staring from a copper clad printed circuit board base material having holes passing there-through at selected locations, said method comprising the steps of:
   a. treating the surface of said circuit board base material with an acid solution of a reduced noble metal electroless metal plating catalyst to form a deposit of said reduced plating catalyst on the surface of said circuit board base material;
   b. treating the surface of said catalyzed circuit board base material with a solution containing a dissolved chalcogen capable of reacting with the electroless metal plating catalyst to form a chalcogenide of said electroless metal plating catalyst; and
   c. metal plating the surface of the article by passing a current between said printed circuit base material and an electrode immersed in an electrolyte containing dissolved plating metal.

7. The method of claim 6 where the electroless metal plating catalyst is a tin-palladium catalyst and the chalcogen is a sulfide.

8. The method of claim 7 where the solution used to form the sulfide of the electroless metal plating catalyst is a solution of an alkali or alkaline earth metal sulfide in a concentration of from 0.001 to 15 grams per liter of solution.

9. The method of claim 6 where the dissolved plating metal is copper.

10. A method for manufacture of a printed circuit board starting from a copper clad printed circuit base material having holes passing there-through at selected locations, said method comprising the steps of:
    a. treating the surface of said circuit board base material with an acid solution of a tin-palladium electroless metal plating catalyst to form a deposit of said catalyst on the surface of said circuit board base material;
    b. treating the surface of the catalyzed circuit board base material with a solution containing a dissolved sulfide capable of reacting with the tin-palladium electroless metal plating catalyst to form a sulfide of said catalyst;
    c. applying a photoresist over the surface of the copper cladding and exposing and developing said photoresist to form an image pattern over said copper cladding; and
    d. metal plating the surface of said printed circuit board base material by passing a current between said circuit board base material and an electrode immersed in an electrolyte containing dissolved plating metal.

11. The method of claim 10 where the solution used to form the sulfide of the tin-palladium plating catalyyst is an aqueous solution of a metal sulfide salt.

12. The method of claim 11 where the solution is a solution of an alkali or alkaline earth metal sulfide in a concentration of from 0.001 to 15 grams per liter of solution.

13. The method of claim 10 where the dissolved plating metal is copper.

14. The method of claim 13 further including a step of coating electroplated copper with a solder etch resist.

15. The method of claim 14 further including the steps of stripping the photoresist from the copper and etching said circuit board to remove copper cladding exposed by removal of said photoresist.

* * * * *